United States Patent [19]

Smith

[11] Patent Number: 5,548,564
[45] Date of Patent: * Aug. 20, 1996

[54] MULTI-LAYER COMPOSITE ULTRASONIC TRANSDUCER ARRAYS

[75] Inventor: Stephen W. Smith, Durham, N.C.

[73] Assignee: Duke University, Durham, N.C.

[ * ] Notice: The term of this patent shall not extend beyond the expiration date of Pat. No. 5,329,496.

[21] Appl. No.: 227,046

[22] Filed: Apr. 13, 1994

Related U.S. Application Data

[63] Continuation-in-part of Ser. No. 962,455, Oct. 16, 1992, Pat. No. 5,329,496.

[51] Int. Cl.$^6$ .................................................. H04R 17/00
[52] U.S. Cl. ......................... 367/140; 367/155; 310/334; 310/336
[58] Field of Search ................................... 367/140, 155; 310/334, 336; 128/662.03

[56] References Cited

U.S. PATENT DOCUMENTS

| | | | |
|---|---|---|---|
| 3,881,466 | 5/1975 | Wilcox | 128/660 |
| 4,211,948 | 7/1980 | Smith et al. | 310/322 |
| 4,217,684 | 8/1980 | Brisken et al. | 310/334 |
| 4,285,010 | 8/1981 | Wilcox | 358/112 |
| 4,296,349 | 10/1981 | Nakanishi | 310/335 |
| 4,489,729 | 12/1984 | Sorenson et al. | 128/660 |
| 4,543,960 | 10/1985 | Harui et al. | 128/660 |
| 4,572,981 | 2/1986 | Zola | 310/357 |
| 4,603,276 | 7/1986 | Coursant | 310/368 |
| 4,638,468 | 1/1987 | Francis | 367/153 |
| 4,747,192 | 5/1988 | Rokurota | 310/327 |
| 4,755,708 | 7/1988 | Granz et al. | 310/334 |
| 4,773,140 | 9/1988 | McAusland | 310/334 |

(List continued on next page.)

FOREIGN PATENT DOCUMENTS

| | | |
|---|---|---|
| 0355694 | 2/1990 | European Pat. Off. . |
| WO89/04143 | 5/1989 | WIPO . |

OTHER PUBLICATIONS

K. R. Erikson, et al.; *Integrated Acoustic Array*, Abstract 1976, pp. 423–445.

J. F. Gelly, et al.; *Properties for a 2D Multiplexed Array For Acoustic Imaging*, 1981 Ultrasonics Symposium, pp. 685–689.

D. H. Turnbull, et al.; *Beam Steering with Pulsed Two–Dimensional Transducer Arrays*, IEEE Transaction on Ultrasonics, Ferroelectrics, and Frequency Control, 38 No. 4, Jul. 1991.

L. S. Buchorr; *Elastomeric Connectors For Land Grid Array Packages*, Connection Technology, Apr. 1989.

A. J. Blodgett, Jr.; *Microelectronic Packaging*, Scientific American, 249(1): 86–96 Jan. 1983.

D. W. Fitting, et al.; *A Two–Dimensional Array Receiver for Reducing Refraction Artifacts in Ultrasonic Computed Tomography of Attenuation*, IEEE Transactions on Ultrasonics, Ferroelectrics, and Grequency Control, Vole UFFC–34, No. 3, May 1987.

Ph Defranould, et al.; *Design of a Two–Dimensional Array for B and C Ultrasonic Imaging System*, Ultrasonics Sympoium Proceedings, IEEE Cat.

M. Pappalardo; *Hybrid Linear and Martrix Acoustic Arrays*, Ultrasonics, pp. 81–86, Mar. 1981.

(List continued on next page.)

Primary Examiner—J. Woodrow Eldred
Attorney, Agent, or Firm—Bell, Seltzer, Park & Gibson

[57] ABSTRACT

A piezoelectric transducer chip comprising a plurality of transducer elements. At least one of the transducer elements is a multi-layer element which comprises a plurality of piezoelectric layers, each of which is separated from the adjacent piezoelectric layers by an electrode layer so that a plurality of capacitive elements is electrically connected in parallel. The plurality of piezoelectric layers are comprised of a plurality of piezoelectric members separated from adjacent members by a gap to form a composite piezoelectric layer. Also disclosed is a method of making a multilayer transducer of a composite piezoelectric material. Alternate embodiments include two-dimensional ultrasonic transducer arrays having multilayer elements formed of a composite piezoelectric material.

25 Claims, 11 Drawing Sheets

U.S. PATENT DOCUMENTS

| | | | |
|---|---|---|---|
| 4,865,042 | 9/1989 | Umemura et al. | 128/660.03 |
| 4,890,268 | 12/1989 | Smith | 367/138 |
| 4,894,013 | 1/1990 | Smith et al. | 434/268 |
| 4,917,097 | 4/1990 | Eberle | 128/661.07 |
| 4,945,915 | 8/1990 | Nagasaki | 128/660.07 |
| 4,958,327 | 9/1990 | Saitoh et al. | 367/137 |
| 4,959,998 | 10/1990 | Yano | 128/661.08 |
| 5,014,711 | 5/1991 | Nagasaki | 128/660.07 |
| 5,045,746 | 9/1991 | Wersing et al. | 310/334 |
| 5,091,893 | 2/1991 | Smith et al. | 367/153 |
| 5,123,415 | 6/1992 | Daigle | 128/661.07 |
| 5,135,486 | 8/1992 | Eberle | 128/660.07 |
| 5,167,233 | 12/1992 | Eberle et al. | 128/660.07 |
| 5,183,048 | 2/1993 | Eberle | 128/660.07 |
| 5,271,403 | 12/1993 | Paulos | 128/660.07 |
| 5,311,095 | 5/1994 | Smith et al. | 310/334 |
| 5,329,496 | 7/1994 | Smith | 367/140 |

OTHER PUBLICATIONS

J. D. Plummer, et al.; *Two–Dimensional Transmit/Receive Ceramic Piezoelectric Arrays: Construction and Performance, IEEE Transactions on Sonics and Ultrasonics*, vol. SU–25, No. 5, Sep. 1978.

R. J. Bobber; *Underwater Electroacoustic Measurements, Measurement Transducers*, 237–285 (1970).

W. A. Smith; *New Opportunities in Ultrasonic Transducers Emerging from Innovations in Piezoelectric Materials, Proceedings*, 1733:3–26 (1992).

N. Bom, et al.; An Ultrasonic Intracardiac Scanner, *Paper received from Thoraxcentre, University Hospital 'Dijkzigt' Rotterdam, the Netherlands*, (1971).

S. W. Smith, et al.; *Performance of Multi–layer PZT Transducer Arrays, IEEE Ultrasoncis Symposium and Short Courses* (1992).

R. L. Goldberg, et al.; *Multi–layer PZT Transducer Arrays for Improved Sensitivity, IEEE Ultrasonics Symposium and Short Courses* (1992).

S. W. Smith, et al.; *Two–Dimensional Array Transducers Using Hybrid Connection Technology, IEEE Ultrasonics Symposium and Short Courses* (1992).

S. W. Smith, et al.; *Two–Dimensional Array Transducers Using Thick Film Connection Technology, IEEE Ultrasonics Symposium and Short Courses*, Abstract (1993).

A. L. Robinson, et al.; Applications of Microelectronics and Microfabrication to Ultrasound Imaging Systems, *IEEE Ultrasonics Symposium* (1992).

R. L. Goldberg, et al.; *In Vivo Imaging Using a Copolymer Phased Array, Ultrasonic Imaging* 14:234–248 (1992).

R. G. Swartz, et al.; *Integrated Silicon–PVF$_2$ Acoustic Transducer Arrays, IEEE Transactions on Electron Devices*, ED–26; 1921–1931 (1991).

J. Mo et al.; *Micromachining for Improvement of Integrated Ultrasonic Transducer Sensitivity, IEEE* (1990).

S. Corbett, et al.; *Conceptual Monolithic Pad Grid Array Connector for Transducer Interconnects, SPIE* 1773: 249–259 (1992).

C. Oakley, et al. *Development of 1–3 Ceramic–Air Composite Transducers, SPIE* 1733: 274–283 (1992).

Pohanka, et al.; *Recent Advances in Piezoelectric Ceramics, Electronic Ceramics: Properties, Devices, and Applications*, pp. 103–113 (1988).

MULTI-LAYER COMPOSITE ULTRASONIC TRANSDUCER ARRAYS

This application is a continuation-in-part of U.S. application Ser. No. 07/962,455 filed Oct. 16, 1992 now U.S. Pat. No. 5,329,496.

FIELD OF THE INVENTION

This application relates generally to the fields of medical diagnostic ultrasound, underwater acoustic imaging, and the associated piezoelectric transducers.

BACKGROUND OF THE INVENTION

Diagnostic ultrasound is an essential modality in virtually every medical specialty and particularly in obstetrics, cardiology and radiology. The ultrasound transducer is the critical component and the limiting factor affecting the quality of diagnostic ultrasound imaging and Doppler measurements. In a conventional circular piston piezoelectric transducer used in mechanical scanning for medical applications (e.g., 19 mm diameter, 3.5 MHz resonant frequency) the electrical impedance of the transducer is approximately 50Ω. Such a transducer is well matched to the conventional electrical transmit circuit for delivering large amounts of acoustic power to the tissue load during the transmit mode. In a like manner, in receive mode, such a transducer is well suited for driving the typical 50Ω or 75Ω coaxial cable connected to the amplifier circuits of the scanning system.

The most sophisticated medical ultrasound scanners now typically use (N×1) linear arrays containing over a hundred transducer elements which may be multiplexed and/or electronically steered and focused via phased array techniques. A linear array transducer for phased array scanning, typically employs much smaller array elements than the conventional transducer described above. For example, a typical linear array includes 128 elements, each of which is 0.2 mm wide by 10 mm long with a resonant frequency of 3.5 MHz. Each piezoelectric ceramic transducer element in a linear array acts as a capacitor of approximately 150 picofarads (pf), which produces an electrical impedance $Z=R_a+jX$ where $X\approx 300\Omega$ at 3.5 MHz. At resonance the reactive component is in series with the radiation resistance $R_a$, which is roughly the same magnitude as X. These higher impedance elements reduce the sensitivity of the transducer for medical ultrasound scanning. The higher impedance element creates an impedance mismatch with conventional transmit circuitry in transmit mode, thus reducing acoustic power transmitted into the patient's body. In receive mode, the high impedance array element suffers significant losses when trying to drive conventional coaxial cable characterized by its capacitance/length.

It has been a significant challenge for the ultrasound community to design and fabricate linear phased arrays for medical ultrasound over the past two decades. Three performance characteristics have established conventional size and geometry of the transducer array elements: (1) the elements have sufficient angular sensitivity to steer the phased array over a ±45° sector angle; (2) The arrays suppress grating lobe artifacts by fine inter-element spacing; and (3) the width of each rectangular element is small compared to the transducer thickness to remove parasitic lateral mode vibrations from the desired transducer pass band. Adherence to these performance characteristics have produced linear arrays having long narrow elements which are sized to be less than one wavelength wide for the ultrasonic frequencies used in tissue imaging, (e.g., <0.3 mm wide ×10 mm long at 3.5 MHz).

Two dimensional (N×M) transducer arrays are believed to hold promise in improving clinical image quality in future diagnostic ultrasound equipment. An immediate clinical application of 2-D phased arrays is the reduction of image slice thickness by focusing in the elevation plane perpendicular to the scanning dimension. An additional application of 2-D transducer arrays is the correction of phase aberrations introduced across the transducer aperture by tissue inhomogeneities. These aberrations occur in two dimensions, so 2-D arrays combined with the proper phase correction signal processing can restore diagnostic image quality. In addition to improving conventional ultrasound B-scan image quality, two-dimensional transducer arrays should assist in the development of new modes of ultrasound imaging. Projected new techniques include: (1) presentation of simultaneous orthogonal B-mode scans; (2) acquisition of several B-scans electronically steered in the elevation direction; (3) development of high-speed C-scans; and (4) high-speed volumetric ultrasound scanning to enable real time three-dimensional imaging and volumetric, angle-independent flow imaging. With known technology, these techniques can only be implemented with 2-D array transducers.

Unfortunately, the design and fabrication problems of one-dimensional transducer arrays become almost overwhelming when extended to a two dimensional array, in which case the element size may be less than 0.2 mm ×0.2 mm for more than 1000 elements in the array. There are two significant obstacles which limit the use of 2-D transducer arrays. First, a simple fabrication method for the electrical connections to such array elements, which can be less than one ultrasound wavelength on a side, is not known. Second, it is very difficult to achieve adequate sensitivity and bandwidth from such small elements.

In the last 15 years there have been several descriptions of prototype 2-D array transducers for medical ultrasonic imaging, but the resulting products were acoustically unsuitable for modern medical ultrasound imaging procedures.

Two dimensional arrays also have been confronted with the problem of high electrical impedance in transducer elements. Two-dimensional arrays have been developed in two geometries. A typical geometry for a 4×32 array transducer is designed for focusing (but not steering) in the elevation direction and for correction of phase aberrations in two dimensions. Such transducers have been called 1.5-D arrays. For a transducer array of this design, each element typically exhibits complex impedance, the magnitude of which is approximately 1000Ω at a resonance of 3.5 MHz; this complex impedance causes an electrical impedance mismatch and the accompanying sensitivity decrease which are more severe than seen in linear arrays. Elements in full 2-D arrays which can steer the ultrasound beam in azimuth as well as elevation may be smaller than 0.2 mm×0.2 mm; these elements exhibit a complex electrical impedance having a magnitude of approximately 5000Ω or greater, so sensitivity is further reduced. Thus, for 1.5-D and 2-D arrays, the development of suitable piezoelectric materials are critical to improved sensitivity.

Unfortunately, the piezoelectric ceramics as described in the prior art are ill suited for such transducers. 1.5-D and 2-D arrays are commonly fabricated by dicing a single piezoelectric chip in two directions with a kerf width as small as 0.01 mm.

In an attempt to address the problem of high electrical impedance in linear arrays, U.S. Pat. No. 4,958,327 to Saitoh et al., teaches the concept of a multi-layer ceramic piezoelectric material consisting of K layers laminated in parallel electrically but in series acoustically. For K layers of uniform thickness, the capacitance of each element is increased by $K^2$; this capacitive increase reduces the electrical impedance of the element by $K^2$ significantly improving transmit efficiency and receive mode sensitivity. However, the teaching of Saitoh is inapplicable to two dimensional arrays; as the electrode layers are short circuited on a side surface of an element, the concept is limited to elements with electrode layers having a surface on the periphery of the transducer, and cannot be used for the elements of the inner rows of two dimensional arrays.

Transducers may be developed using a piezoelectric substrate fabricated from a composite of a piezoelectric ceramic phase such as PZT and an inert phase such as a polymer epoxy. However, piezoelectric composites produce a lower relative dielectric constant than PZT alone due to the presence of the epoxy phase. The lower dielectric constant results in a lower capacitance and thus a higher electrical impedance than PZT. The higher electrical impedance has limited the use of PZT/epoxy composites in the small elements of steered linear phased arrays and two dimensional arrays. Moreover, the lower dielectric constant exacerbates the high impedance problem of two dimensional array elements described above.

In view of the foregoing, it is an object of the present invention to provide a transducer array having decreased acoustic impedance, decreased electrical impedance and suppressed lateral mode.

An additional object of the present invention is to provide a method of making a transducer chip having decreased acoustic impedance, decreased electrical impedance and suppressed lateral mode.

It is a further object of the invention to provide an ultrasound transducer array which contains such a transducer chip.

It is an additional object of the invention to provide ultrasound diagnostic devices which utilize a transducer array as described.

SUMMARY OF THE INVENTION

These and other objects are satisfied by the present invention, which includes as a first aspect a piezoelectric transducer chip comprising a plurality of transducer elements arranged in a two-dimensional array. At least one of the transducer elements is a multi-layer element which comprises a plurality of piezoelectric layers, each of which is separated from the adjacent piezoelectric layers by an electrode layer so that a plurality of capacitive elements are electrically connected in parallel. The piezoelectric layers may also be comprised of a plurality of piezoelectric members wherein the members are separated from adjacent members to provide a gap between adjacent piezoelectric members and thereby form a piezoelectric composite layer. A first via connects a first set of alternating electrode layers, and a second via connects a second set of alternating electrode layers. The first via is insulated from the second set of alternating electrode layers, and the second via is insulated from the first set of alternating electrode layers. At least one of the plurality of multi-layer elements has an internal edge. At least one of the vias of a multi-layer element is an internal via.

A second aspect of the present invention is an ultrasonic transducer array utilizing a two-dimensional piezoelectric chip as described above. The transducer array comprises the 2-D chip, a connector having an array of connector pads for electrically connecting the connector to the chip, means for electrically connecting a first set of alternating electrode layers of the chip to ground, and means for electrically connecting a second set of alternating electrode layers of the chip to a corresponding one of the connector pads.

A third aspect of the invention is an ultrasonic scanner utilizing the 2-D chip. The scanner comprises means for producing an ultrasonic signal, an ultrasonic transducer array which includes the 2-D chip, means for amplifying a received ultrasonic signal, and means for processing and displaying the ultrasonic signal. In a preferred embodiment, the scanner is a medical diagnostic tool for ultrasonic scanning of tissue.

A fourth aspect of the present invention is a multi-layer ultrasonic transducer array made of a piezoelectric composite.

A fifth aspect of the present invention is a method of making a multi-layer ultrasonic transducer comprised of a piezoelectric composite material.

DETAILED DESCRIPTION OF THE INVENTION

The present invention provides a two-dimensional ultrasound transducer array having improved sensitivity with small transducer elements. It does so by providing a transducer chip with multiple piezoelectric layers which can be fabricated using multi-layer ceramic (MLC) technology.

Alternate piezoelectric layers are electrically connected through the use of "vias."

Figure 1:
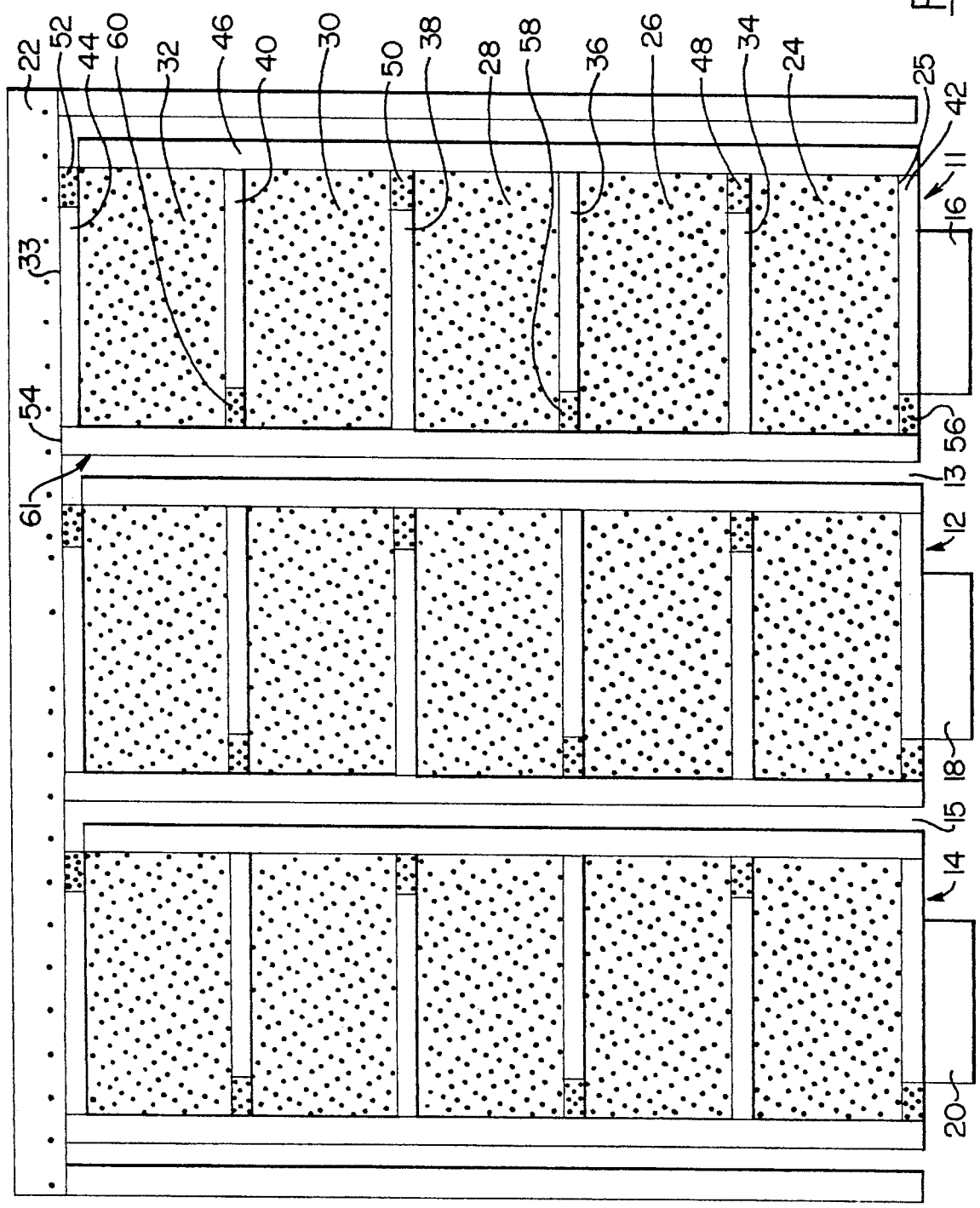
FIG. 1 is a side cross-sectional view of a 3×3 two dimensional transducer array with five piezoelectric layers.
Figure 2:
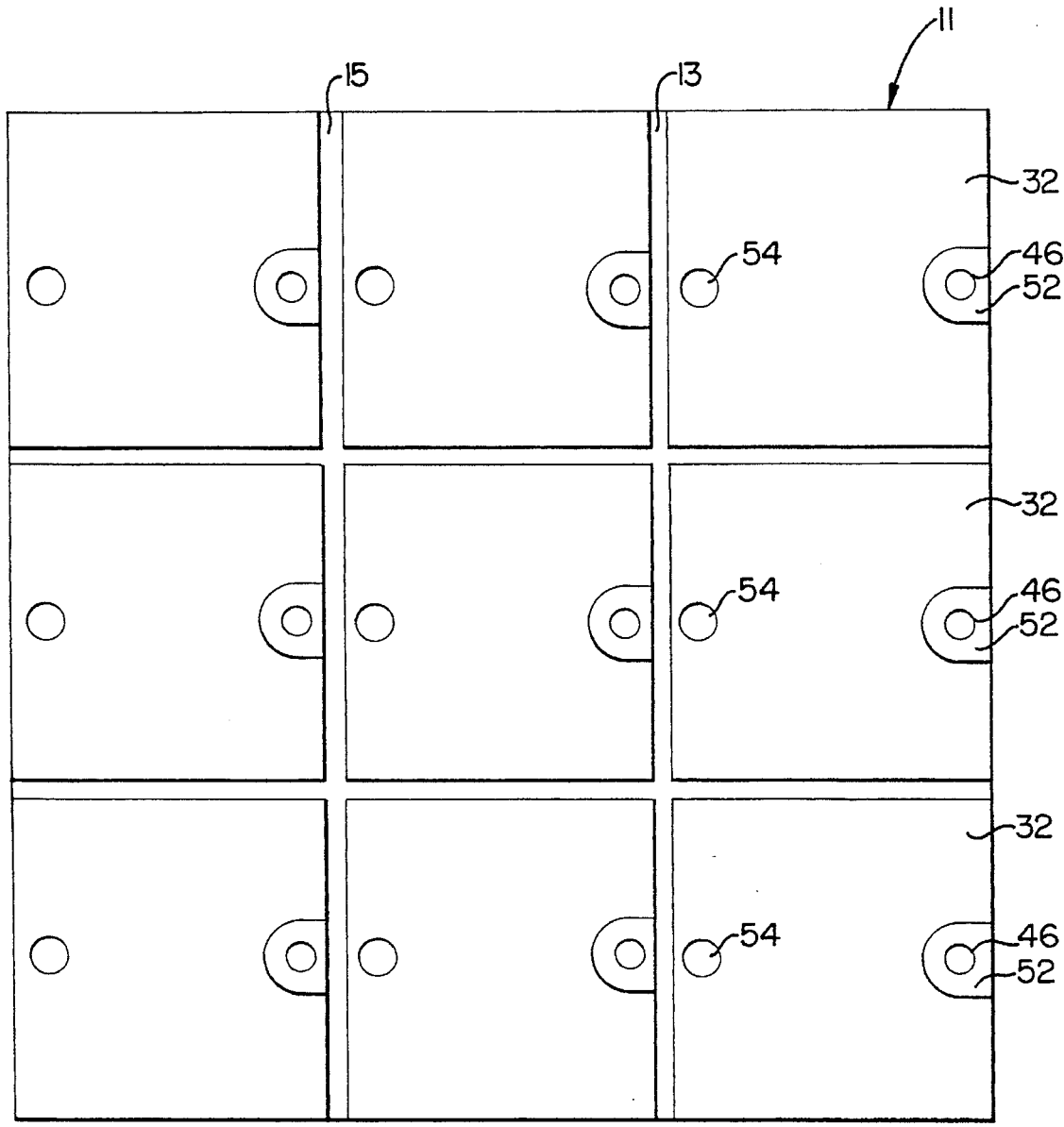
FIG. 2 is a top view of a 3×3 two dimensional transducer array.

An exemplary embodiment of a transducer chip of the present invention is illustrated in FIGS. 1 and 2, which show schematically a transducer chip 10 comprising a 3×3 array of transducer elements. Those skilled in this art will recognize that the invention is not restricted to arrays of this size, but can include any two dimensional transducer array, which as used herein refers to a transducer having a plurality of elements arranged in a plurality of rows (N) and a plurality of columns (M) in a rectangular N×M grid.

FIG. 1 shows three adjacent transducer elements 11, 12, and 14, each of which is separated from the adjacent transducer element by a kerf 13, 15. Each kerf 13, 15 can be filled with air or with some filler material such as polymers, epoxies, glass balloons, plastic balloons, and the like. Each transducer element 11, 12, 14 is electrically connected to a corresponding connector pad 16, 18, 20. Each of the transducer elements 11, 12, and 14 comprises five piezoelectric layers (illustrated for element 11 as layers 24, 26, 28, 30, 32) arranged in a vertical stack. Those skilled in this art will appreciate that although five piezoelectric layers are shown herein, any number of piezoelectric layers can be included. Each of the piezoelectric layers 24, 26, 28, 30, 32 is separated from its adjacent layers by an electrode layer (illustrated as layers 34, 36, 38, 40. An additional electrode layer 42 contacts the lower surface 25 of the lowermost piezoelectric layer 24, and also contacts the connector pad 16. Likewise, an additional electrode layer 44 contacts the upper surface 33 of the uppermost piezoelectric layer 32, and also contacts a ground plate 22 which covers all of the transducer elements.

Alternate electrode layers 42, 36, and 40 are electrically connected by a "via" 46, which as used herein is an electrical connection which extends through an aperture in the layers of a multilayer substrate to electrically connect certain of the layers of the element. In the present embodiment, the via 46 extends from just beneath electrode layer 44 to electrode layer 42 and contacts electrode layers 36 and 40, thereby connecting these layers. The via 46 is insulated from connection with electrode layers 34, 38, and 44 by insulation gaps 48, 50 and 52. In the same manner, via 54 connects electrode layers 34, 38, and 44 by extending along an internal surface 61 of the transducer element 11 from electrode layer 44 to an insulation gap 56 which insulates the via 54 from electrode layer 42. As used herein, an "internal surface" of a transducer element is a surface which adjacently faces another element in another row or column across the kerf 13, as opposed to serving as the peripheral surface of the array and thus being easily accessible for connection. Insulation gaps 58 and 60 insulate the via 54 from the electrode layers 36 and 40 respectively.

The two-dimensional nature of the transducer chip 10 can be best seen in FIG. 2, which shows the chip at the depth of electrode layer 44. The vias 54 each extend to and thus electrically connect this electrode layer. In contrast, the presence of the insulation gaps 52 prevents the vias 46 from electrically connecting with this electrode layer. The same configuration would be seen at electrode layers 34 and 38. For electrode layers 42, 36, and 40, the insulation gaps 56, 58, and 60 prevent electrical connection between the vias 54 and these electrode layer, but vias 46 do connect these electrode layers. Although they are shown herein to be located on the internal surfaces of the transducer elements, it is to be understood that the vias of the present invention can be prepositioned during fabrication so they can be located at any desired point on each element, such as an internal surface or even within the interior volume of the element. As used herein, a via which is located on an internal surface or within the interior volume of an element is referred to as an "internal via."

The interconnection of the first set of alternating electrode layers 42, 36, 40 by a first via 46 and the interconnection by a second via 54 of a second set of alternating electrode layers 34, 38, 44 interposed between the first set of alternating electrode layers provides an element which comprises five capacitive elements connected in parallel. As a result, the capacitance of the total transducer element 11 is increased over a single piezoelectric layer of the same thickness as the total stack by the square of the number of layers; i.e., in this instance by $5^2=25$. Accordingly, the impedance of this element is reduced by that same factor, which improves the impedance match of these elements to electrical sources to which they are typically attached.

As those skilled in this art will appreciate, the number and thickness of piezoelectric layers in an element can vary depending on the character of the connecting device. In a preferred embodiment, the piezoelectric layers of a transducer chip 10 can be between about 0.01 and 0.15 mm in thickness, and more preferably can be between about 0.02 and 0.06 mm in thickness. As an example, to achieve a resonant frequency of 2.5 MHz in a conventional 2-D array transducer, a PZT chip of thickness of about 0.6 mm is required. A typical MLC-produced piezoelectric layer thickness is 0.04 mm after sintering, so K=11 layers can be easily included in a 2.5 MHz chip. Thus, the capacitance of each layer of the MLC element would be increased by a factor of 11 and the capacitance of the complete stack of 11 capacitors in parallel for a single element will be increased by $K^2=11^2=121$. The element impedance is then reduced by a factor of 121 from 5KΩ to 41Ω, an excellent match to a 50Ω electrical source.

The present invention may be used over a wide range of operating frequencies of from about 1 MHz to about 10 MHz and above. The physical dimensions and number of elements in the two-dimensional array will depend upon the application of the transducer array. For example, a square array of square transducer elements can be utilized for three dimensional imaging systems. Square transducer elements of from about 0.05 mm to about 1 mm are suitable for three dimensional imaging using frequencies of from about 10 MHz to about 1 MHz. However as smaller dimensions are utilized, operating frequencies of greater than 10 MHz may be achieved. The desired frequency of ultrasound determines the height of the chip; for example, for a 20 MHz signal, the chip can be ≈0.05 mm, and for a 1 MHz signal, the chip can be ≈1 mm. The thickness of the chip then determines the depth of the kerf.

Figure 3A:
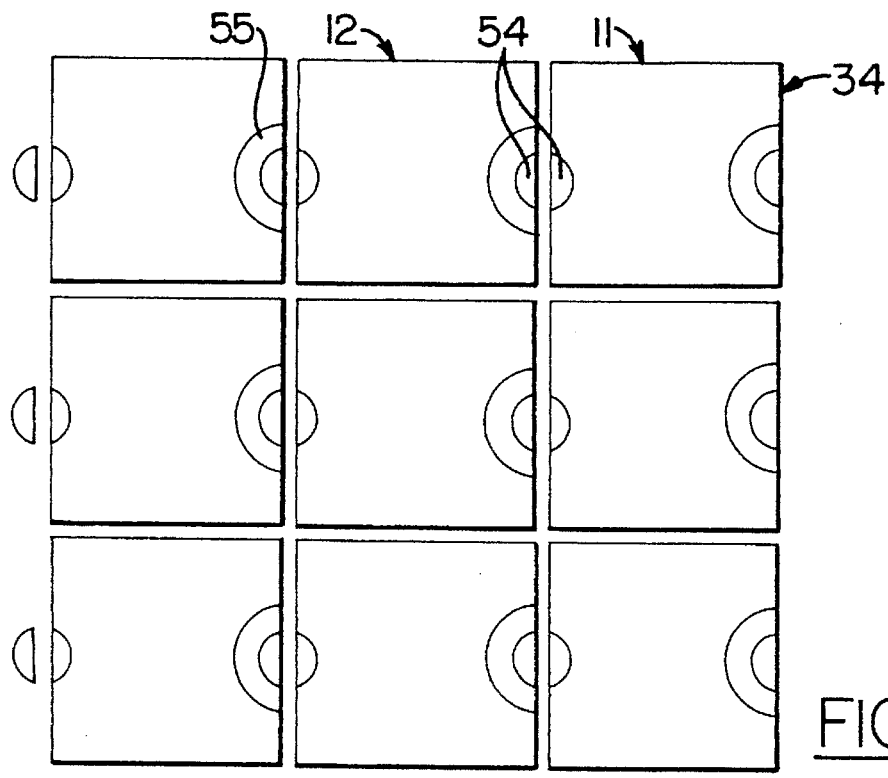
FIG. 3A is a top section view of a two dimensional array having split vias taken through an electrode layer of a first set of alternating electrode layers.
Figure 3B:
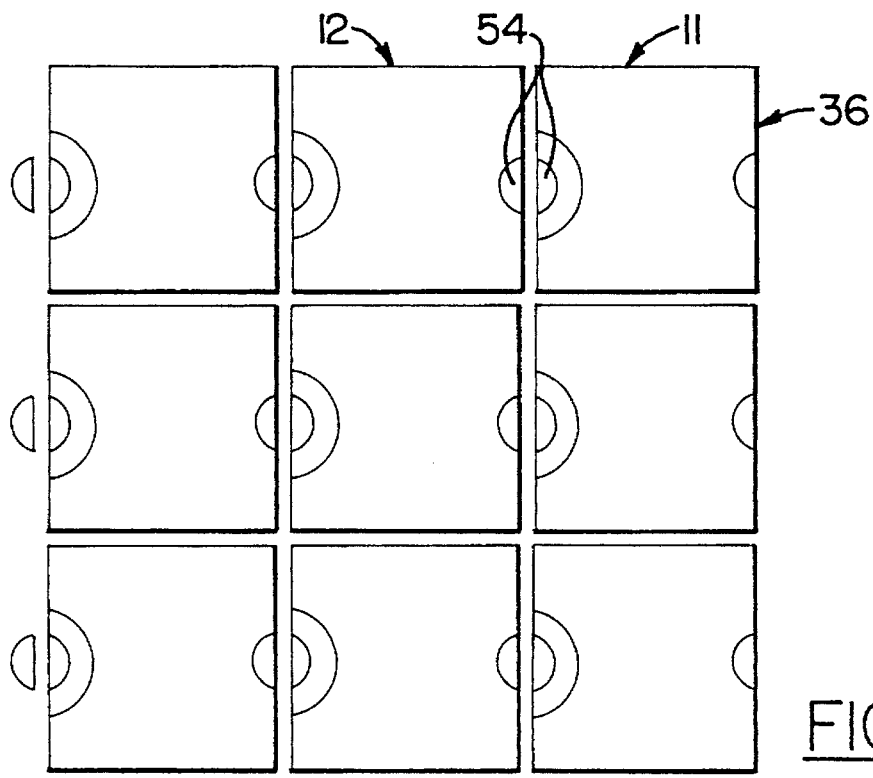
FIG. 3B is a top section view of a two dimensional array having split vias taken through an electrode layer of a second set of alternating electrode layers interposed between the first set of electrode layers of FIG. 3A.

In an alternative embodiment, each circular via in FIG. 2 can be split, as shown in FIGS. 3A and 3B, which illustrate electrode layers 34, 38, 44 (FIG. 3A) and electrode layers 42, 36, 40 (FIG. 3B). The result is a transducer chip wherein a single circular via 54 can independently connect electrode layers 34, 38, 44 on the left edge of element 11 (FIG. 3A) as well as independently connecting layers 42, 36, 40 on the right edge of element 12 (3B). In this configuration, a single via is able to serve two independent elements. This design feature of splitting each via offers the additional advantage that one side of each split via is grounded so that two signal vias are not immediately adjacent separated only by the saw kerf. This design will reduce electrical cross talk in the piezoelectric MLC.

In an alternative embodiment to the foregoing, for fabrication reasons it may be advantageous for a split via, rather than having one half of the split via in contact with the electrode layer of one element and the other half of the split via insulated from the same electrode layer on the adjacent element, instead to comprise halves which are mirror images of one another about a plane defined by the center of the kerf separating the adjacent elements. Thus in FIG. 3A, via 54 would be in contact with electrode layer 34 on both element 11 and element 12. Split via 55, located on the other (leftmost in FIG. 3A) surface of element 12, would then be insulated from electrode layer 34 by an insulation gap. This pattern would continue for the other electrode layers 38, 44 in contact with electrode layer 34 and for other elements of the array. In a similar fashion, for electrode layer 36 shown in FIG. 3B, the half of split via 54 associated with element 12 (the left half in FIG. 3B) would be insulated from electrode layer 36 by an insulation gap which mirrors that shown for element 11. On the leftmost edge of element 12, the split via would be in contact with the electrode layer. The same pattern would be followed for electrode layers 42, 40.

Figure 4:
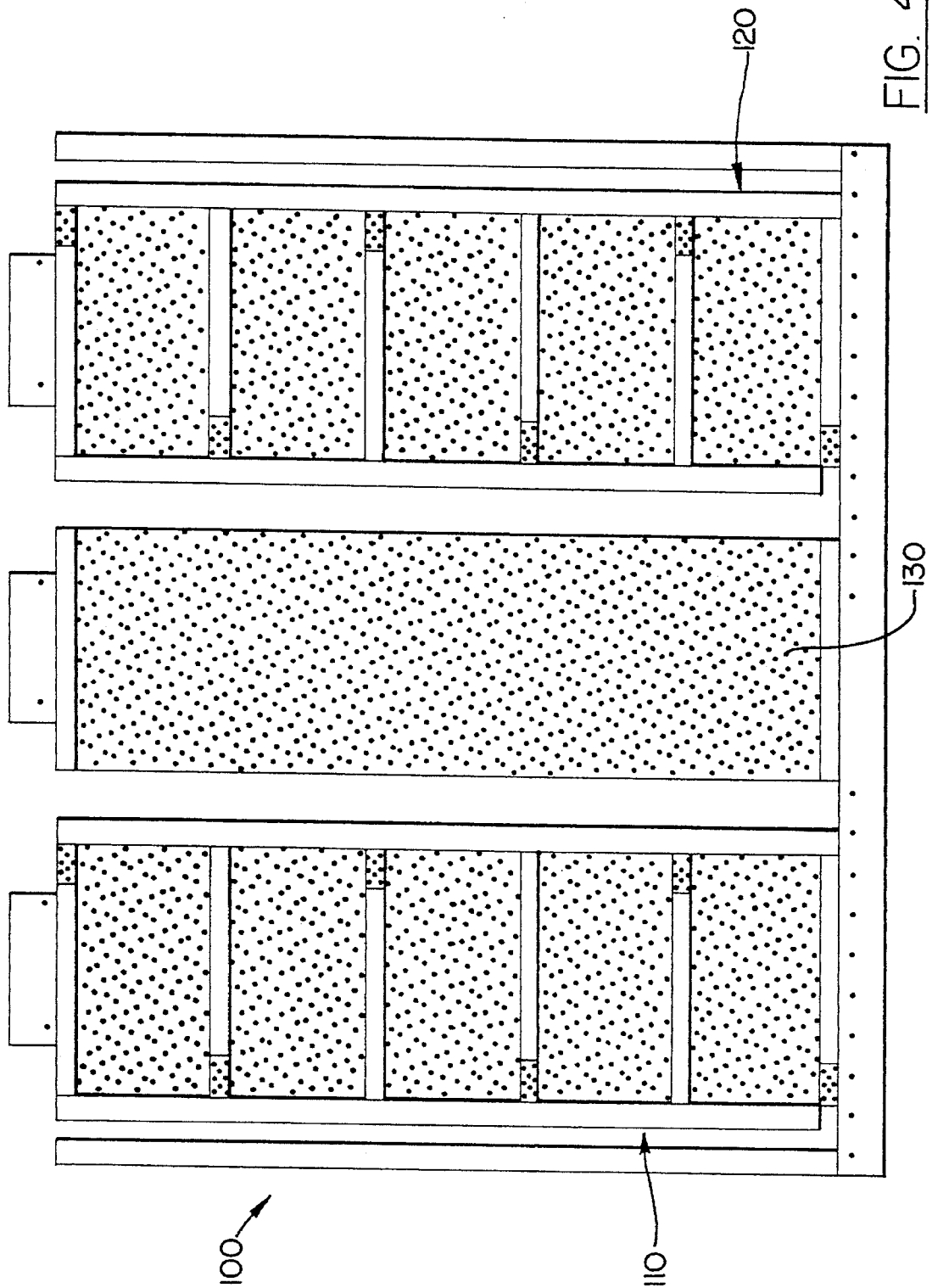
FIG. 4 is a side cross-sectional view of a 3×3 two dimensional transducer array with two elements having five piezoelectric layers and one single layer element.

An additional alternative embodiment is schematically illustrated in FIG. 4 as a three-element two-dimensional array. A transducer chip 100 comprises two multilayer elements 110, 120 similar in configuration to those described above, and an element 130 comprising a single piezoelectric layer 130. By mixing a plurality of single layer elements and plurality of multilayer elements within the same two-dimensional array, the pulse-echo sensitivity of the transducer can be improved further.

Fabrication of a MLC piezoelectric chip, which is based on computer aided design, proceeds as follows. PZT powder is mixed with organic binders, plasticizers, and solvents to form a slurry. The slurry is spread to form a thin layer and heated to form a so-called "green tape." Slurry thickness is controlled using a doctor blade technique; exemplary is a green tape thickness of between 0.05 and 0.15 mm. Multiple holes are punched (mechanically or by laser), drilled, or etched into the tape to form the vias on each layer. The via holes are filled with a metal paste (e.g. silver or platinum) and the surface electrodes (silver or platinum paste) for each layer are laid down by screen printing excluding the insulation gaps. Multiple layers of green tape are then superimposed to align the vias, the multi-layer sandwich is laminated and then finally sintered to form a single package. Metallization is then plated or vacuum deposited on the input pads.

This transducer chip 10 then can be attached to a substrate containing electrical contact pads 16, 18 and 20 using any number of methods of bonding techniques. One such bonding technique uses conductive epoxy for a resistive contact. Another bonding technique uses a thin film approximately 1 micron thick of nonconductive epoxy for a capacitive contact. The electrical contact pads are connected to wires or vias in a multi-layer ceramic connector, traces on a circuit board, or flexible polymer circuit material. Optional conductive films can be deposited onto the piezoelectric chip 10 to produce a plurality of $\lambda/4$ matching layers to tissue.

This structure can then be divided into a plurality of transducer elements by any procedure which creates separate piezoelectric elements, such as dicing with a dicing saw. Dicing may be carried out using K & S Diamond Wheel Dicing Saw which produces kerf widths about 25 microns. The size and shape of the transducer elements is determined by the dicing pattern and is typically a square or checkerboard pattern. However other patterns such as parallelograms, circles and rhombuses may be used depending upon the specific application of the transducer array. The actual configuration of the transducer array, however, may be selected by selectively establishing electrical connections to specific transducer elements in the checkerboard, by selective placement of connector pads or vias or by other electrical means. Active transducers may be configured by virtue of said selective connections in any number of predetermined patterns such as a cross, a filled or unfilled rectangle or a filled or unfilled circle. Note that through selection of active transducer elements, the patterns for the send transducers may be the same or different from the pattern for the receive transducers. As a final step, the ground plate 22, usually a conductive foil, is then bonded to the piezoelectric chip 10 with a bonding agent.

An exemplary chip of the present invention formed by this method is 16 layers of PZT-5A, each layer being 0.08 mm thick, to yield a stack thickness of 1.3 mm (assuming 20 percent shrinkage during sintering). This stack has a resonant frequency of about 1.0 MHz.

Figure 5:
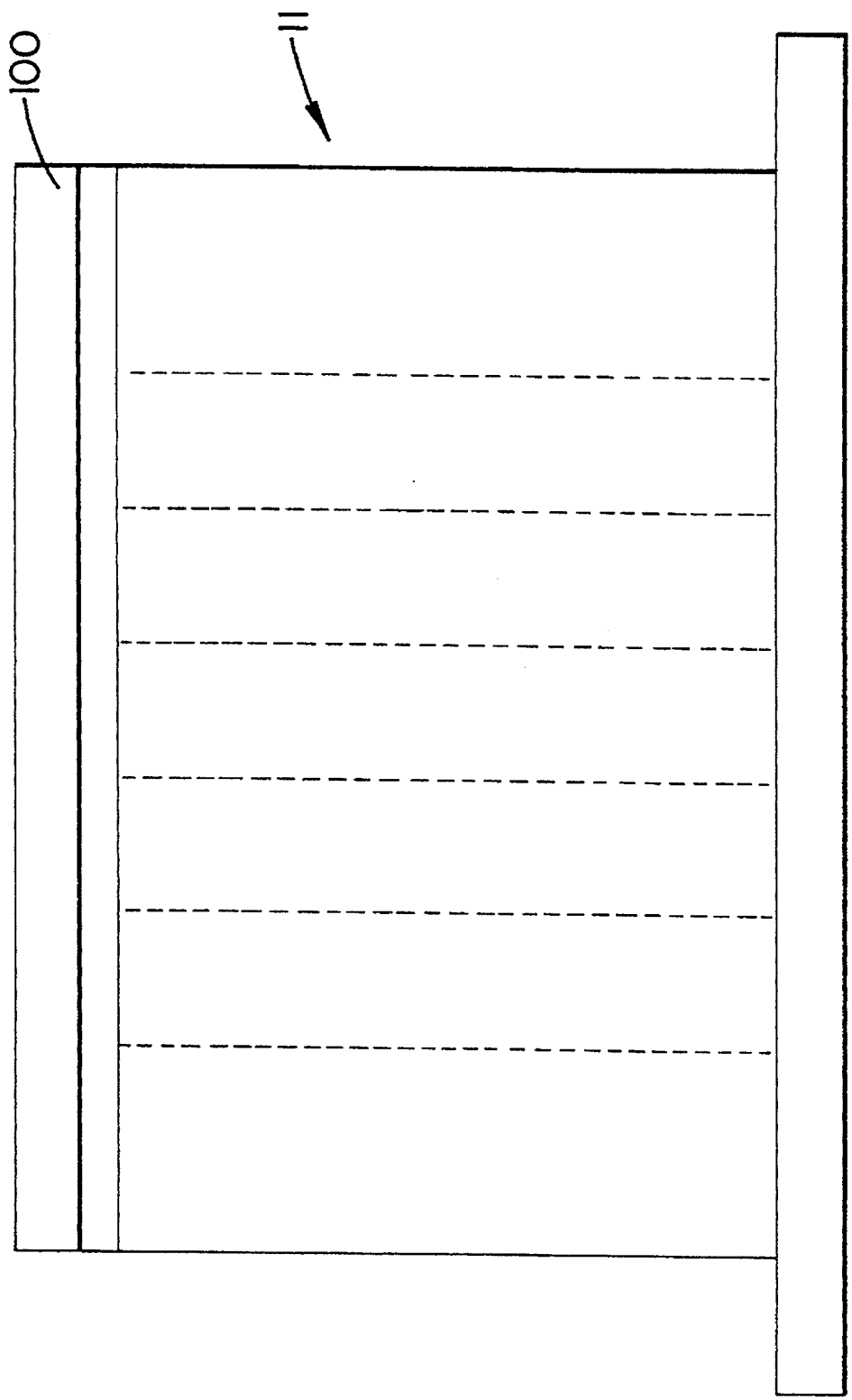
FIG. 5 is a cross-sectional view of a two-dimensional array including an upper stand-off for improved image quality obtained by direct contact of the transducer on a subject's skin.

FIG. 5 shows an alternate embodiment of the present invention which includes a stand-off 100 to allow improved use of the present invention for medical imaging applications by allowing improved contact with the skin surface of a patient for small acoustic windows on the body such as the inter-costal space between the ribs for cardiac ultrasound diagnosis. This stand-off may be fabricated using conventional technology.

Optionally, the two-dimensional array ultrasonic transducer of the present invention may have means for redistributing the electrical connections of the connection pads 16, 18, 20 so as to increase the distance between electrical connections to a greater distance than that between individual connector pads 16, 18, 20. This increase in spacing between electrical connections allows for simpler connection to external electronics such as voltage sources and input amplifiers. The increased spacing allows for the use of coaxial connections between the transducer array and the external electronics which results in reduced noise in the electrical output from the transducer and thereby increases the usable sensitivity of the transducer array. The increased spacing is accomplished through conventional bond wiring, circuit boards, flexible polymer circuits, or the use of MLC technology which is illustrated and described in co-pending U.S. patent application Ser. No. 07/883,006, the entirety of which is incorporated herein by reference.

Figure 6:
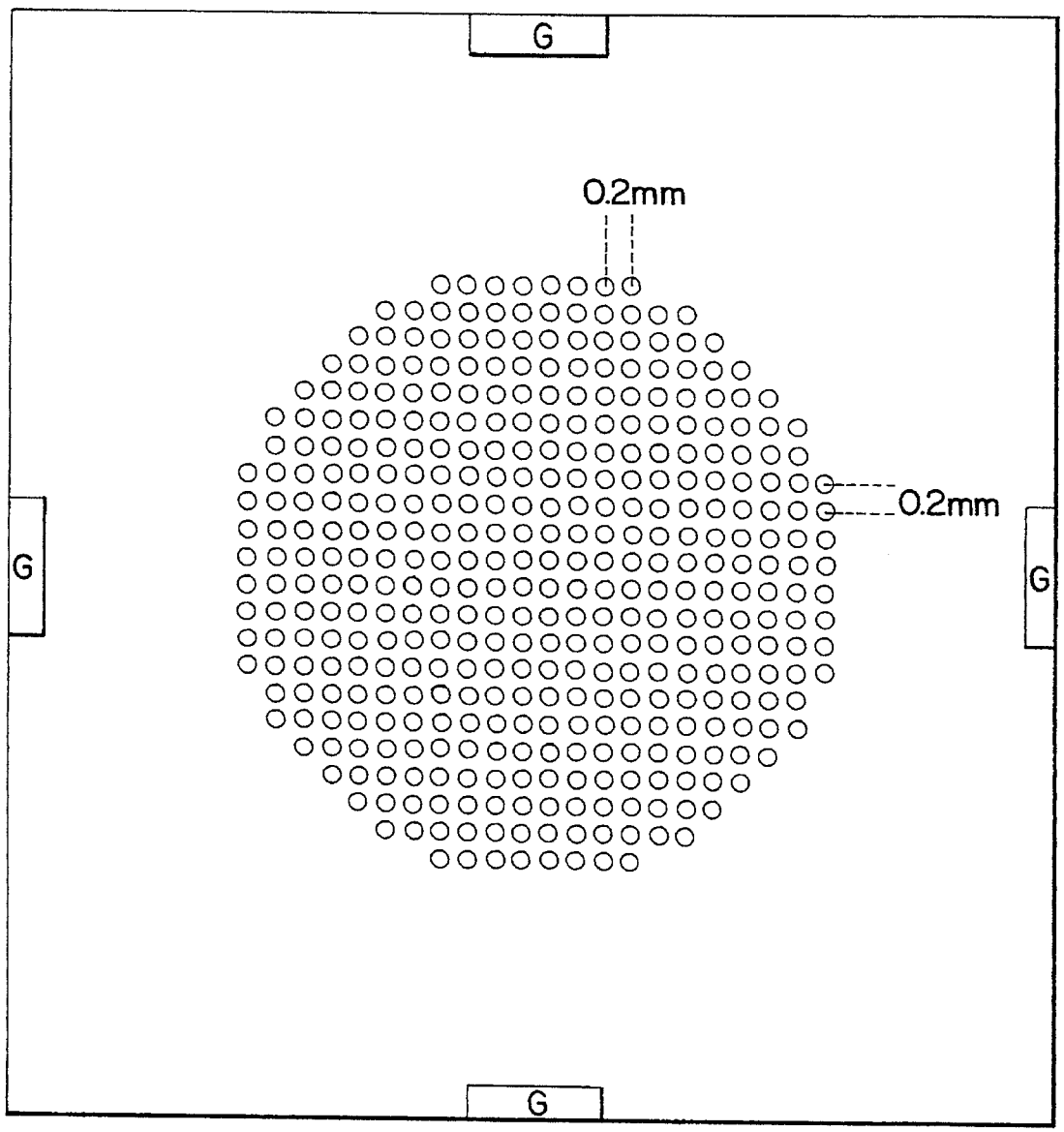
FIG. 6 is a top view of the footprint of a transducer to be incorporated into a handle for easier use.
Figure 7:
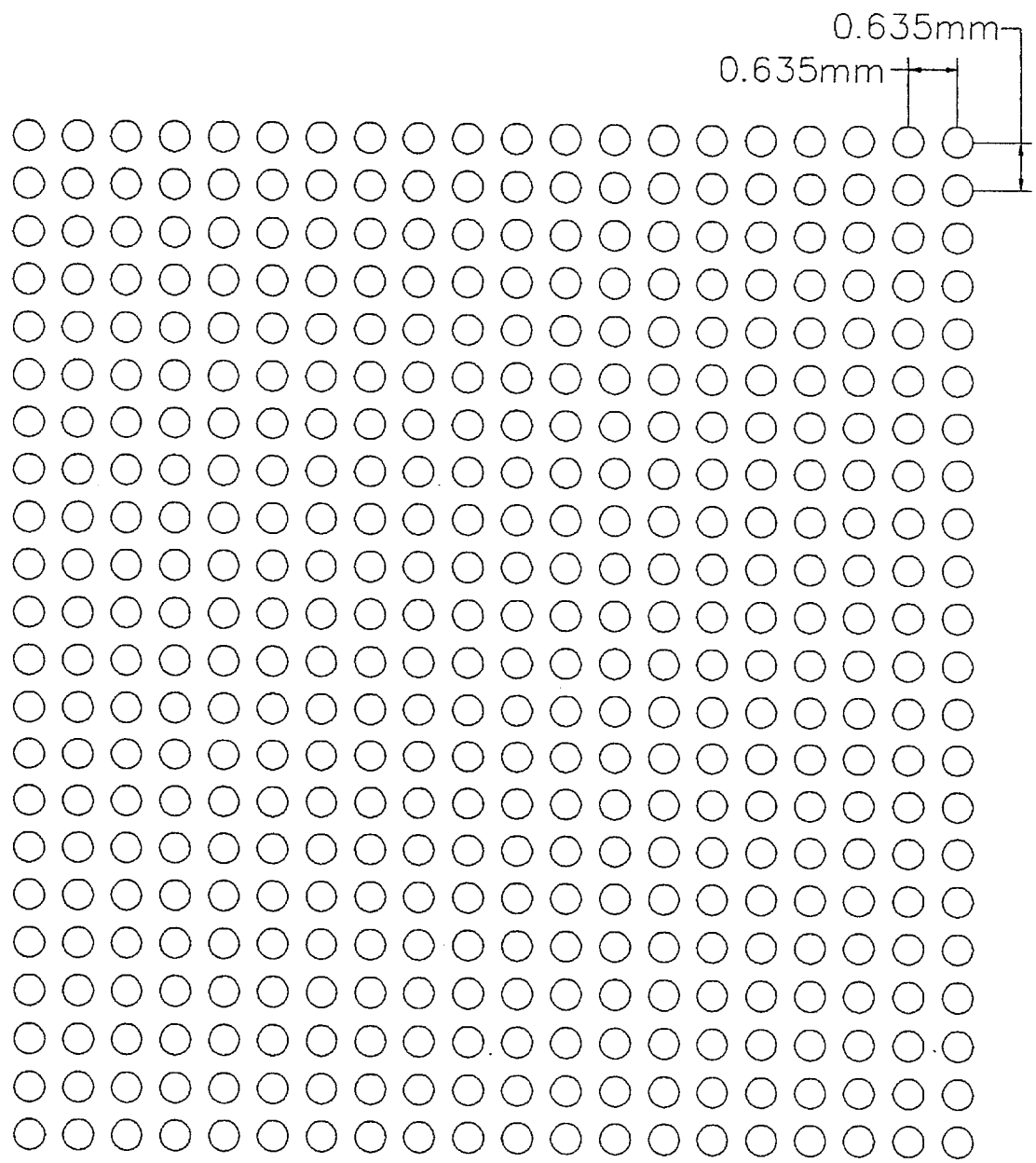
FIG. 7 is a bottom view of the transducer of FIG. 6 showing wider interelement spacing.

The two dimensional array ultrasonic transducer of the present invention may also be incorporated into a handle for easier use in medical and other applications. An example of the top view of the transducer is shown in FIG. 6, in which the interelement transducer spacing is 0.2 mm so that the total footprint on the skin surface is only a 5 mm×5 mm square. FIG. 7 shows the bottom view of the transducer of FIG. 6 and shows a flange containing a pad grid array for connection to an optional transducer handle. The interelement spacing of the pads is 0.635 mm so that a redistribution, or fan-out, occurs in the connector, thereby enabling easier electrical connection to the cables of the transducer handle.

Uses for the present invention include three dimensional ultrasound imaging or volumetric measurements and thin slice ultrasound imaging. In use, the transducer elements of the two-dimensional array ultrasonic transducer are excited by a voltage source in electrical connection with the transducer elements through the connector. The electrical voltage source places an electrical voltage across the element to produce an ultrasonic output from the element. These voltages typically range from about 50 volts to about 300 volts. The voltage excites the transducer element to produce an ultrasonic signal which is transmitted from the transducer array into a test region. When receiving ultrasonic signals, the ultrasonic signal excites a transducer element to produce an electrical voltage across the transducer element. This electrical voltage is then amplified by an amplifier in electrical connection with the transducer element through the connector. A further advantage of the present invention is the ability to use what is known in the art as "cavity down" positioning of an integrated circuit with the connector to provide amplifiers for receive and transmit mode use of the transducers in a single integrated package. Using the "cavity down" method, an integrated circuit is mounted directly onto the connection side of the multilayer ceramic connector thereby incorporating the integrated circuit as part of the transducer array assembly and allowing for the integration of the circuitry into the handle of the transducer array to provide a more compact unit.

Figure 8:
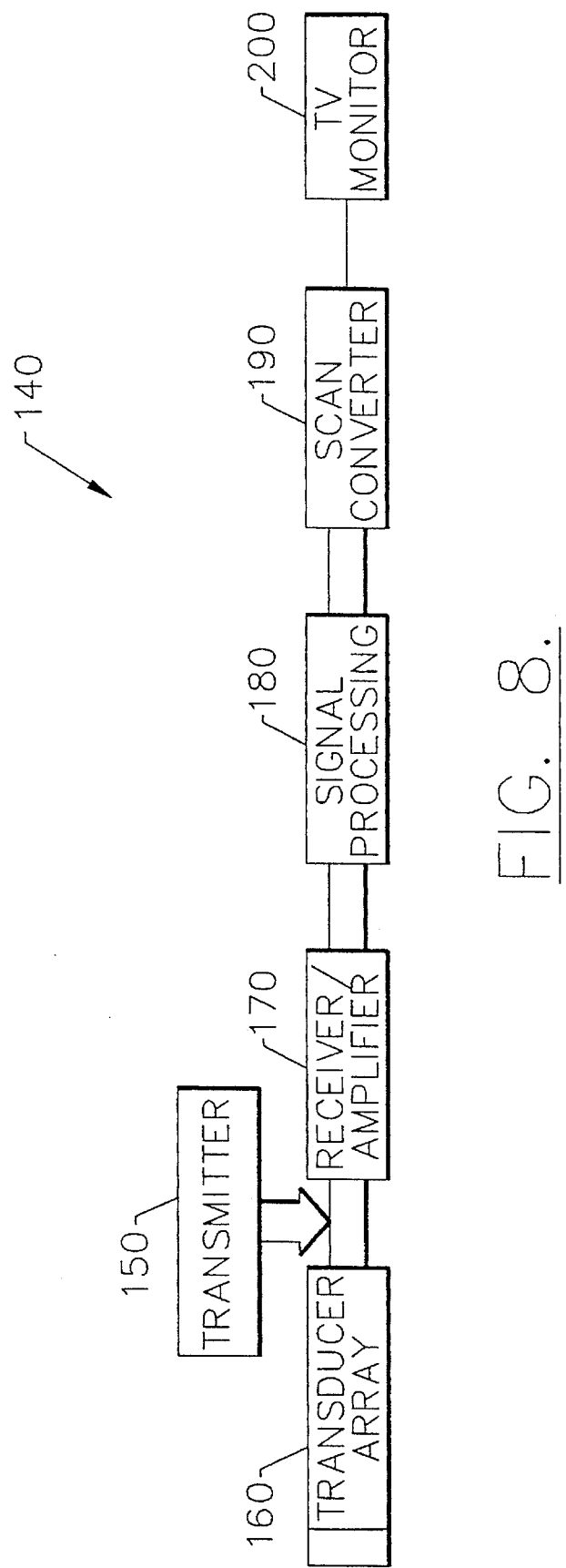
FIG. 8 is a block diagram showing the electrical connections of an ultrasonic scanner for medical diagnostic use.

FIG. 8 shows a block diagram of a phased array medical ultrasonic scanner 140. The scanner includes transmitter circuitry 150, a transducer array 160 of the present invention, receiver amplifier circuitry 170, signal processing circuitry 180, such as envelope detection and filtering, a scan converter 190, and a television monitor 200.

Other aspects of the present invention will now be described with reference to the two-dimensional multi-layer transducer array described above. However, as will be appreciated by one of skill in this art, the advantages and benefits of the following embodiments are also applicable to linear and 1.5D arrays. Thus, linear arrays with reduced acoustic impedance and suppressed lateral mode may be made through the use of multilayer elements of piezoelectric composite materials. Thus, as will be appreciated by those of skill in this art, greatly simplified manufacturing techniques and transducer array layouts may be used to produce, for example, linear transducer arrays of multi-layer piezoelectric composite materials while still obtaining the benefits and advantages of the present invention.

In one embodiment of the present invention, a two dimensional ultrasonic transducer array is comprised of a piezoelectric composite material. In the fabrication of two dimensional ultrasonic transducer arrays, the critical descriptor of piezoelectric composites is the so called connectivity which describes the self connection of each phase in 1, 2, or 3 dimensions. Previously, the best performance of a PZT/ epoxy composite for medical ultrasound transducers uses a 1-3 connectivity, i.e., a regular array of PZT members aligned in the thickness dimension of the transducer (connectivity=1) surrounded by a matrix of epoxy (connectivity= 3).

Currently, the limiting factor in fabrication is the minimum PZT member size which presently results in an array of members 0.025 mm in diameter so that even a small array element 0.2 mm×0.2 mm would allow as many as 5×5=25 members per element. For a piezoelectric ceramic component of PZT-5H with a relative dielectric constant of $\epsilon^s_{33}=$ 1430, one arrives at a dielectric constant of approximately 800 for a composite of 50% volume fraction of PZT combined with 50% epoxy. This low dielectric constant exacerbates the high electrical impedance problem of two dimensional array elements. Thus the number of layers required to achieve a low electrical impedance is increased for this example composite material by the ratio of 1430/800, relative to that of a PZT MLC. PZT/air composite may also be used. In this case, for PZT-5H, the relative dielectric constant of a 50% PZT/50% air composite is 715, and the number of layers required in an MLC 2-D array is increased by a factor of 2. For example, we have recently fabricated a 1.5D array transducer from MLC PZT-5H material including electrical vias as described above. The array included 3×43= 129 elements and consisted of 3 layers each 0.22 mm for a total stack thickness 0.66 mm. If the array were fabricated from a 1-3 connectivity composite (50% volume fraction PZT/50% air), a 6 layer stack would be required with each layer thickness=0.11 mm. For 1.5D arrays, typical layer thicknesses are from about 0.01 mm to about 0.3 mm.

There are several alternate implementations to fabricate a multi-layer two dimensional array of the 1-3 connectivity composite material. However, it should be noted that in the firing and sintering processes for the MLC materials, temperatures approaching 2000° C. are often used to achieve a rigid structure. Thus all organic components are burned off leaving essentially a PZT/air composite.

Figure 9:
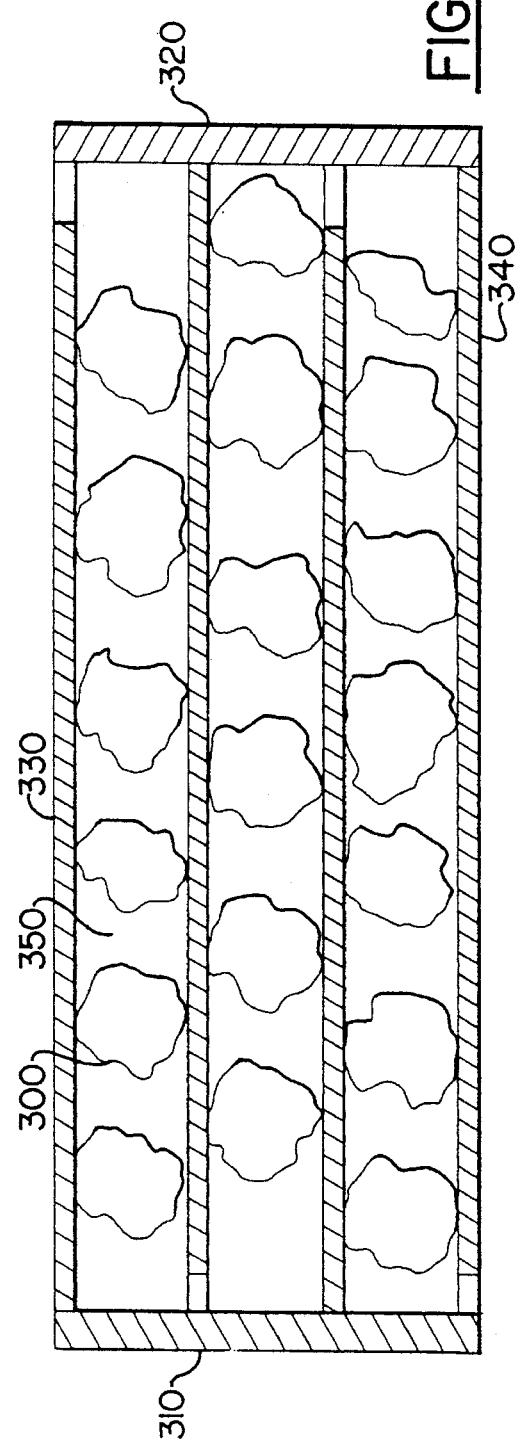
FIG. 9 is a cross-sectional view of a transducer element according to the present invention prior to heat curing the piezoelectric composite.

FIG. 9 illustrates a cross-section of a single element in a two dimensional array composed of a 3 layer 1-3 connectivity piezocomposite of 50% PZT/50% air. The simplest method of producing such an MLC material, as shown in FIG. 9, is to make each layer an independent 1-3 connectivity composite by simply using a PZT particle 300 which is approximately the size of the green tape layer thickness while maintaining a 50% volume fraction of PZT. As seen in FIG. 9, the PZT particles 300 are placed between electrode layers 330, 340 with an air gap or organic filler 350 separating adjacent particles. Alternating electrodes are interconnected by a ground via 310 and a signal via 320 to produce the multilayer element as described above. While FIG. 9 illustrates the placement of the PZT particles 300 as a cross-section of the multiple layers, the PZT particles 300 may actually be distributed in a two-dimensional pattern for a given layer. After drilling the vias, electroding, laminating, firing and sintering, and poling, using conventional MLC fabrication techniques, each layer in the MLC stack exhibits the properties of the 1-3 connectivity PZT/air composite since each layer is independently electroded.

In a more labor intensive fabrication method, one can use a conventional dicing and filling technique to produce the PZT members in each green tape layer. Laser milling or jet machining may be used to form the members in the ceramic green tape before backfilling with epoxy. However, it should be noted that in both these methods, there is no alignment or connectivity of PZT particles or members between layers.

Figure 10:
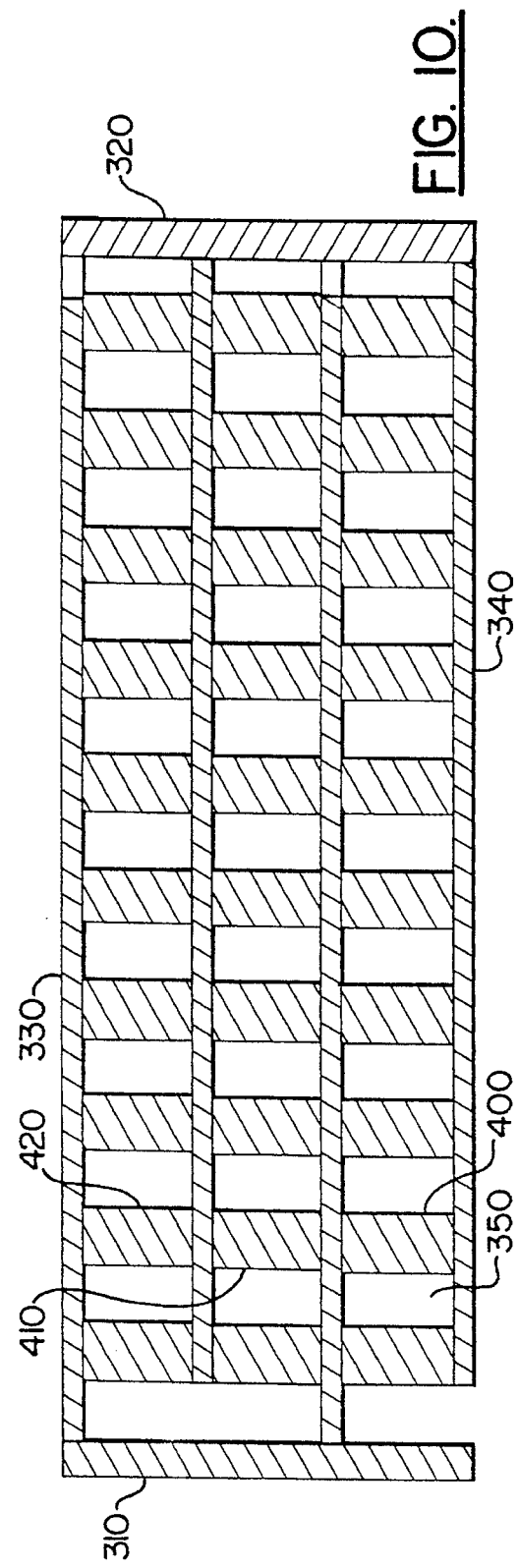
FIG. 10 is a cross-sectional view of a piezoelectric composite transducer element according to the present invention.
Figure 11A:
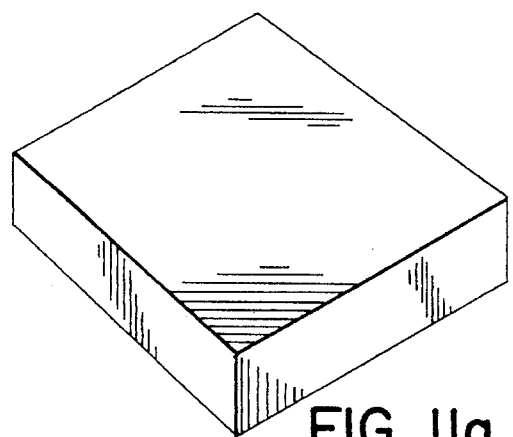
FIG. 11 pictorially represents a piezoelectric ceramic layer at various stages of fabrication.
Figure 11B:
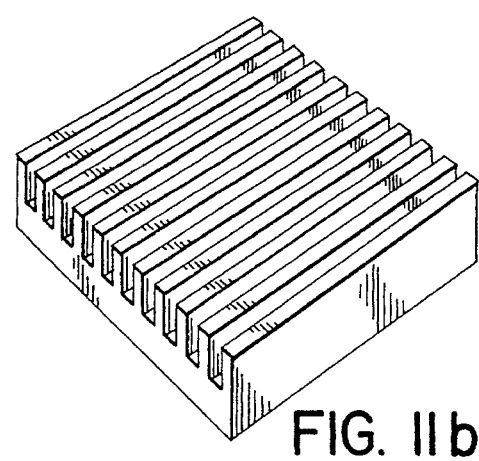
Figure 11C:
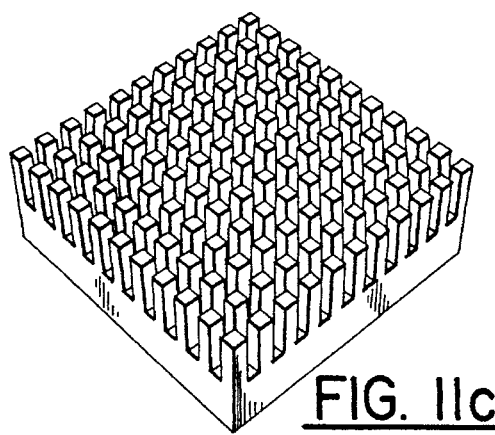
Figure 11D:
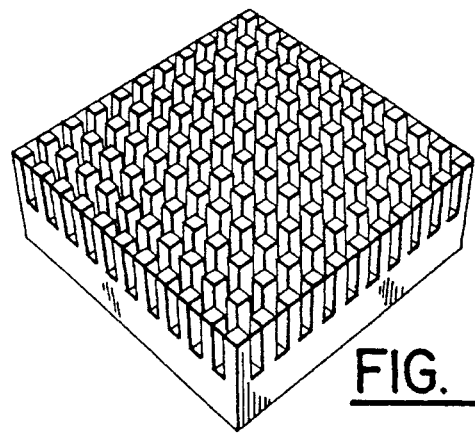
Figure 11E:
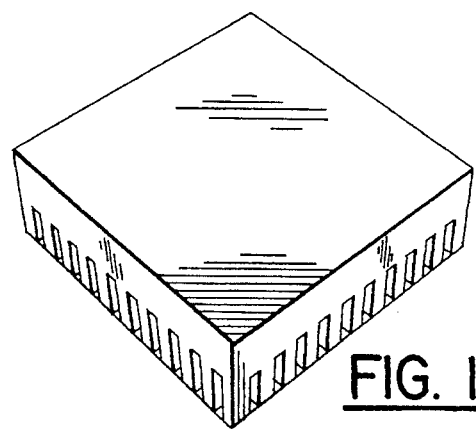
Figure 11F:
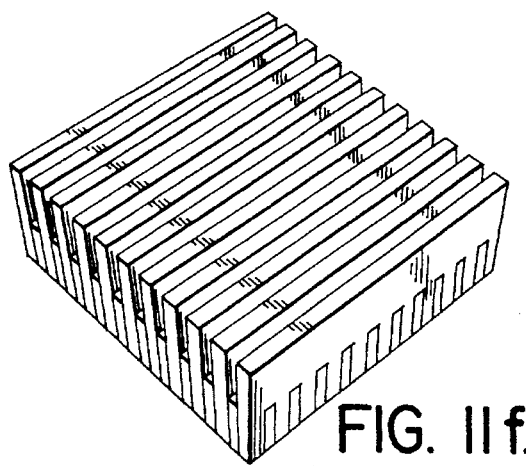
Figure 11G:
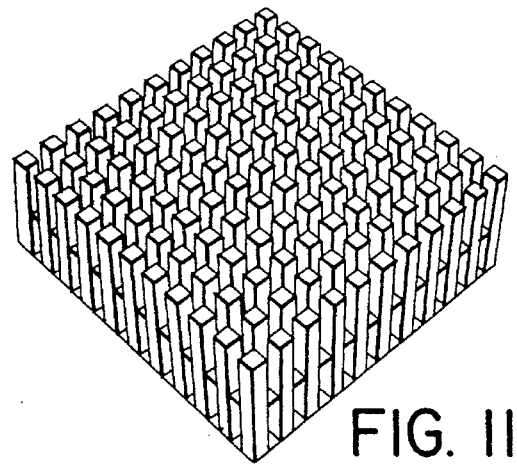
Figure 11H:
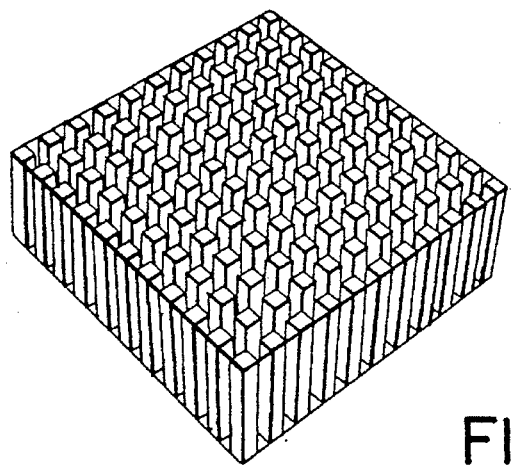

FIG. 10 illustrates the cross-section of a completed composite element of a two-dimensional transducer array. As seen in FIG. 10, the piezoelectric layer is comprised of a plurality of piezoelectric members 400 separated by a gap 350 which may be filled with air or an organic filler. Suitable fillers for the gap 350 include epoxies, poly methyl methacrylate in cellulose acetate, poly vinyl alcohol or the commercially available organic binder Cladan produced by Tam Ceramics, Inc. of Niagra Falls, N.Y. The piezoelectric member 400 may be a piezoelectric rod and may be rectangular, circular, elliptical or other suitable cross-sectional shape. As FIG. 10 further illustrates, the piezoelectric members 400, 410, 420 are aligned across the layers of the multilayer element. Furthermore, as described above, these piezoelectric members 400, 410, 420, may be arranged in a two-dimensional pattern. However, to allow for alignment of the piezoelectric members, the two-dimensional pattern of the members should be the same from layer to layer or misalignment may occur. The layers of piezoelectric members are separated by the signal electrodes 340 and the ground electrodes 330 as described above to form the multilayer transducer element.

Alignment or registration of the members of a 1-3 connectivity PZT composite between layers of the MLC can be achieved by using the dice and fill fabrication method on each individual layer of PZT ceramic. This process may be used on individual PZT plates or on PZT green tapes which have undergone a preliminary firing process to make the green tapes more rigid. Before lamination each PZT layer is diced by a diamond wheel, dicing saw, jet machining, or laser scribed and filled with epoxy or an organic material using the conventional techniques to obtain the post patterns shown in FIG. 10. In one technique, two sets of deep grooves are cut in a block of piezoceramic at right angles to each other. A polymer is then cast into these grooves and the solid ceramic base is ground off. After polishing the plate to final thickness, electrodes are applied to the faces and the ceramic is poled by applying a strong electric field, usually at slightly elevated temperatures. FIGS. 11(a) through 11(h) illustrate an alternative method of forming the piezoelectric members. As seen in FIG. 11, to create the piezoelectric posts for a particular layer, a ceramic plate of the desired thickness (FIG. 11(a)) may be diced with two sets of grooves perpendicular to each other (FIGS. 11(b) and 11(c)). These grooves only extend partially through the ceramic plate. A polymer is then vacuum cast into the grooves (FIG. 11(d)) with a lid (not shown) waxed onto the top of the ceramic to prevent any polymer from coating the tops of the pillars. The ceramic plate is then turned over (FIG. 11(e)) and the process repeated with the grooves on the opposite side of the ceramic plate being aligned with the first set of grooves (FIGS. 11(f) and 11(g)). The second set of grooves are then vacuum cast with a polymer (FIG. 11(h)) and the capping plates (not shown) are removed.

After fabrication of the piezoelectric members for a given layer, electrodes are screen printed and fired and vias are drilled for each layer. The PZT posts of one layer are then aligned with those of the next layer using the same alignment techniques and registration holes normally used to align the vias of conventional multilayer ceramics. Finally, the stack is laminated to obtain the 1-3 connectivity PZT/air composite MLC stack with PZT posts aligned between layers.

It should be noted that there are also lower temperature processes to fabricate multi-layer ceramic connectors in the electronic industry using firing temperatures below 1000° C. Applying these processes, it will be possible to use an inert material including a perfluoroalkyl polymer such as Teflon® or Zonal sold by E. I. Dupont between the PZT posts which will not burn off during the firing, laminating, sintering steps. Organic binders may also be deposited in the gap by vacuum impregnation after heating These composites will exhibit higher dielectric constant than a PZT/air composite. In an alternate implementation, a sheet of polyimide substrate commonly used in microelectronic connectors is etched by conventional photolithographic methods or by conventional reactive ion etching in the desired pattern leaving a cavity in the polyimide for each PZT post. A fine grain slurry of PZT is used to fill the cavities with the polyimide. Vias and electrodes for a two dimensional array transducer are implemented as in conventional thin film technology for polyimide substrates, i.e., sputtering or vacuum deposition. The vias and PZT are aligned between multiple identical layers, the layers are laminated and cured leaving a 1-3 connectivity PZT/polyimide composite MLC.

In the above description, certain aspects of the present invention were described with respect to the use of PZT as a piezoelectric material. However, the present invention is not limited to the use of PZT but may also utilize other piezoelectric materials or ferroelectric materials. Certain aspects of the present invention have also been described with respect to 1-3 connectivity material. However, the present invention may also utilize or produce other connectivity materials, such as 2-2 or 0-3 connectivity materials.

The foregoing is illustrative of the present invention and is not to be construed as limiting thereof. For example, other methods of fabrication of the present invention may be utilized while still benefitting from the teachings of the present invention. Those skilled in this art will also appreciate that other methods of increasing the distance between electrical connections to the transducer elements of the present invention may be utilized. The invention is accordingly defined by the following claims, with equivalents of the claims to be included thereof.

That which is claimed:

1. A piezoelectric transducer chip comprising:

a plurality of transducer elements, at least one of said transducer elements being a multilayer element comprising a plurality of piezoelectric layers and a plurality of electrode layers forming a plurality of capacitative elements electrically connected in parallel, each of said plurality of piezoelectric layers being separated from the adjacent piezoelectric layers by one of said plurality of electrode layers, and said piezoelectric layers consisting of a first set of alternating electrode layers and a second set of alternating electrode layers interposed between said first set of alternating electrode layers; and wherein each of said piezoelectric layers of said multilayer element is a piezoelectric composite material comprising a plurality of piezoelectric members formed between adjacent electrodes of said plurality of electrode layers each of said members being spaced apart from adjacent members to thereby form a gap between each of said plurality of piezoelectric members.

2. A piezoelectric transducer chip according to claim 1, wherein said plurality of transducer elements comprises a plurality of multilayer elements.

3. A piezoelectric transducer chip according to claim 1, wherein said piezoelectric members are PZT.

4. A piezoelectric transducer chip according to claim 1, wherein the gap between said piezoelectric members is filled with a material selected the group consisting of air and organic binders.

5. A piezoelectric transducer chip according to claim 1, wherein at least one of said transducer elements has a single piezoelectric layer.

6. A piezoelectric transducer chip comprising:

a plurality of transducer elements arranged in a two-dimensional array, at least one of said transducer elements being a multilayer element having an internal edge portion and comprising a plurality of piezoelectric layers and a plurality of electrode layers forming a plurality of capacitive elements electrically connected in parallel, each of said plurality of piezoelectric layers being separated from the adjacent piezoelectric layers by one of said plurality of electrode layers, and said piezoelectric layers consisting of a first set of alternating electrode layers and a second set of alternating electrode layers interposed between said first set of alternating electrode layers;

wherein each of said piezoelectric layers of said multilayer element is a piezoelectric composite comprising a plurality of piezoelectric members formed between adjacent electrodes of said plurality of electrode layers each of said members being spaced apart from adjacent members to thereby form a gap between each of said plurality of piezoelectric members;

a first via electrically connecting said first set of alternating electrode layers, said first via being electrically insulated from said second set of alternating electrode layers; and a second via electrically connecting said second set of alternating electrode layers, said second via being electrically insulated from said first set of alternating electrode layers;

wherein at least one of said vias is an internal via.

7. A piezoelectric transducer chip according to claim 6, wherein said plurality of transducer elements comprises a plurality of multilayer elements.

8. A piezoelectric transducer chip according to claim 6, wherein said piezoelectric members are PZT.

9. A piezoelectric transducer chip according to claim 6, wherein the gap between said piezoelectric members is filled with a material selected from the group consisting of air and organic binders.

10. A piezoelectric transducer chip according to claim 6, wherein said first via is insulated from said second set of alternating electrodes by a plurality of insulating gaps.

11. A piezoelectric transducer chip according to claim 6, wherein said second via is insulated from said first set of alternating electrodes by a plurality of insulating gaps.

12. A piezoelectric transducer chip according to claim 6, wherein at least one of said transducer elements has a single piezoelectric layer.

13. An ultrasonic transducer array comprising:

(a) a connector having an upper surface, a lower surface, and an array of connector pads formed in said connector for electrically connecting said upper surface to said lower surface;

(b) a piezoelectric transducer chip having a plurality of transducer elements arranged in a two-dimensional array, at least one of said transducer elements being a multilayer element having an internal edge portion and comprising a plurality of piezoelectric layers and a plurality of electrode layers forming a plurality of capacitive elements electrically connected in parallel, each of said plurality of piezoelectric layers being separated from the adjacent piezoelectric layers by one of said plurality of electrode layers, and said piezoelectric layers consisting of a first set of alternating electrode layers and a second set of alternating electrode layers interposed between said first set of alternating electrode layers and wherein each of said piezoelectric layers of said multilayer element is a piezoelectric composite material comprising a plurality of piezoelectric members formed between adjacent electrodes of said plurality of electrode layers each of said members being spaced apart from adjacent members to thereby form a gap between each of said plurality of piezoelectric members;

(c) a first via connecting said first set of alternating electrode layers, said first via being electrically insulated from said second set of alternating electrode layers; and (d) a second via connecting in parallel said second set of alternating electrode layers, said second via being electrically insulated from said first set of alternating electrode layers;

wherein at least one of said vias is an internal via;

(e) means for electrically connecting said first set of alternating electrodes to ground; and (f) means for electrically connecting said second set of alternating electrodes to a corresponding one of said connector pads.

14. An ultrasonic transducer array according to claim 13, which further comprises a metallic ground sheet which overlies said piezoelectric transducer chip and is electrically connected to said means for electrically connecting said first set of alternating electrodes.

15. An ultrasonic transducer array according to claim 13, wherein said means for electrically connecting said second set of alternating electrodes comprises a bonding layer to connect to said upper surface of said connector.

16. An ultrasonic transducer array according to claim 13, wherein said piezoelectric chip comprises a plurality of multilayer elements.

17. An ultrasonic transducer array according to claim 13, wherein said piezoelectric chip comprises at least one multilayer element which includes a first internal edge and a second internal edge, and wherein said first via is an internal via, and wherein said second via is an internal via.

18. A piezoelectric transducer chip according to claim 13, wherein said piezoelectric members are PZT.

19. A piezoelectric transducer chip according to claim 13, wherein the gap between said piezoelectric members is filled with an organic binder.

20. An ultrasonic scanner comprising:

(a) means for producing an ultrasonic signal;

(b) an ultrasonic transducer array of claim 1 operatively connected to said means for producing an ultrasonic signal for transmitting said ultrasonic signal to a target;

(c) means for amplifying a received ultrasonic signal from a target operatively connected to said ultrasonic transducer array; and (d) means for processing said ultrasonic signal operatively connected to said amplifying means.

21. A method of making a two-dimensional transducer chip having at least one multilayer transducer element of a piezoelectric composite material, said method comprising:

forming a first piezoelectric layer comprising a plurality of members of piezoelectric material wherein each member of said plurality of members is spaced apart from adjacent members to thereby form a gap between said piezoelectric members;

forming a second piezoelectric layer comprising a plurality of members of piezoelectric material wherein each member of said plurality of members is spaced apart from adjacent members to thereby form a gap between said piezoelectric members and wherein said piezoelectric members are positioned to form said pattern;

forming a first electrode layer on said first piezoelectric layer to electrically connect each of said piezoelectric members to the remainder of said piezoelectric members of said first piezoelectric layer; and attaching said second piezoelectric layer to said first electrode layer such that the piezoelectric members of said first piezoelectric layer are aligned with the piezoelectric members of said second piezoelectric layer and so that each of said piezoelectric members of said second piezoelectric layer are electrically connected to the remainder of said piezoelectric members of said second piezoelectric layer and so that said first piezoelectric layer is electrically connected to said second piezoelectric layer.

22. The method of claim 21, further comprising the steps of:

positioning said piezoelectric members of said first piezoelectric layer to form a pattern; and positioning said piezoelectric members of said second piezoelectric layer to form said pattern.

23. The method of claim 21, further comprising the step of filling the gap between said piezoelectric members with an organic binder.

24. The method of claim 21, further comprising the steps of:

forming an electrode layer on the free end of said first piezoelectric layer to electrically connect each of said piezoelectric members to the remainder of said piezoelectric members of said first piezoelectric layer; and forming an electrode layer on the free end of said second piezoelectric layer to electrically connect each of said piezoelectric members to the remainder of said piezoelectric members of said first piezoelectric layer.

25. The method of claim 24 further comprising the step of selectively connecting said electrode layers so as to form a plurality of capacitive elements electrically connected in parallel.

* * * * *